United States Patent
Shang et al.

(10) Patent No.: US 11,282,424 B2
(45) Date of Patent: Mar. 22, 2022

(54) FLEXIBLE DISPLAY PANEL, FLEXIBLE DISPLAY APPARATUS, AND DISPLAY CONTROL METHOD THEREOF

(71) Applicant: BOE TECHNOLOGY GROUP CO., LTD., Beijing (CN)

(72) Inventors: Guangliang Shang, Beijing (CN); Seungwoo Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 640 days.

(21) Appl. No.: 16/301,843

(22) PCT Filed: Apr. 19, 2018

(86) PCT No.: PCT/CN2018/083699
§ 371 (c)(1),
(2) Date: Nov. 15, 2018

(87) PCT Pub. No.: WO2019/041830
PCT Pub. Date: Mar. 7, 2019

(65) Prior Publication Data
US 2021/0223871 A1    Jul. 22, 2021

(30) Foreign Application Priority Data
Aug. 29, 2017 (CN) .......................... 201710757232.5

(51) Int. Cl.
*G09G 3/20*   (2006.01)
*G01B 7/16*   (2006.01)
(Continued)

(52) U.S. Cl.
CPC ................. *G09G 3/20* (2013.01); *G01B 7/18* (2013.01); *G06F 3/03* (2013.01); *G09G 3/035* (2020.08)

(58) Field of Classification Search
CPC . G06F 3/03; G01B 7/18; G09G 3/035; G09G 2380/02; G09G 3/20
See application file for complete search history.

(56) References Cited

U.S. PATENT DOCUMENTS 9,135,863 B2   9/2015  Duerksen et al.
9,513,502 B2  12/2016  Chen et al.
(Continued)

FOREIGN PATENT DOCUMENTS

CN   106775083 A    5/2014
CN   104252817 A   12/2014
(Continued)

OTHER PUBLICATIONS

Office Action dated Mar. 5, 2020, issued in counterpart CN Application No. 201710757232 5, with English translation (13 pages).
(Continued)

*Primary Examiner* — Stephen G Sherman
(74) *Attorney, Agent, or Firm* — Westerman, Hattori, Daniels & Adrian, LLP (57) ABSTRACT

The present disclosure is related to a flexible display panel. The flexible display panel may include a display substrate, a plurality of pixel units arranged in an array on the display substrate, and at least a strain sensor on the display substrate. The strain sensor may be arranged corresponding to a region comprising at least one of the plurality of pixel units. The strain sensor may be configured to detect deformation in the region comprising at least one of the plurality of pixel units and to generate a detection signal.

12 Claims, 9 Drawing Sheets

(51) Int. Cl.
G09G 3/00 (2006.01)
G06F 3/03 (2006.01)

(56) References Cited

U.S. PATENT DOCUMENTS

| | | | | |
|---|---|---|---|---|
| 2002/0196243 | A1* | 12/2002 | Morita | G09G 3/3611 345/204 |
| 2014/0331781 | A1* | 11/2014 | Lee | G06F 1/1626 73/849 |
| 2015/0169006 | A1 | 6/2015 | Chong et al. | |
| 2017/0185289 | A1* | 6/2017 | Kim | G06F 1/1641 |
| 2017/0315658 | A1* | 11/2017 | Vandermeijden | G06F 3/0446 |

FOREIGN PATENT DOCUMENTS

| | | |
|---|---|---|
| CN | 104254871 A | 12/2014 |
| CN | 104715692 A | 6/2015 |
| CN | 105702193 A | 6/2016 |
| CN | 105867699 A | 8/2016 |
| CN | 106910842 A | 6/2017 |
| KR | 10-2017-0025870 A | 3/2017 |
| KR | 2017-0074614 A | 6/2017 |

OTHER PUBLICATIONS

International Search Report dated Jul. 23, 2018, issued in counterpart International Application No. PCT/CN2008/083699. (11 pages).
Extended (Supplementary) European Search Report dated Mar. 23, 2021, issued in counterpart EP Application No. 18826166 3. (9 pages).

* cited by examiner

FLEXIBLE DISPLAY PANEL, FLEXIBLE DISPLAY APPARATUS, AND DISPLAY CONTROL METHOD THEREOF

CROSS-REFERENCE TO RELATED APPLICATIONS

This application claims benefit of the filing date of Chinese Patent Application No. 201710757232.5 filed on Aug. 29, 2017, the disclosure of which is hereby incorporated in its entirety by reference.

TECHNICAL FIELD

This invention relates to display technology, and more particularly, to a flexible display panel, a flexible display apparatus, and a display control method thereof.

BACKGROUND

A flexible display apparatus has certain advantages. For example, it can be bent, folded, and manufactured into a wide variety of forms and the like. Thus, the flexible display apparatus has been widely used in a plurality of fields.

It is important to control display of the flexible display apparatus in response to various forms of deformation of the flexible display apparatus. This can not only enrich the display mode of the flexible display apparatus, but also meet special display requirements under various forms of deformation.

BRIEF SUMMARY

Accordingly, one example of the present disclosure is a flexible display panel. The flexible display panel may include a display substrate, a plurality of pixel units arranged in an array on the display substrate, and at least one strain sensor on the display substrate. The at least one strain sensor may be configured to detect deformation of the flexible display panel. Each of the at least one strain sensor may correspond to a region of the flexible display panel comprising a plurality of rows of pixel units and may be configured to detect the deformation in the region of the flexible display panel. The at least one strain sensor may include a plurality of strain sensors, and the plurality of the strain sensors may be arranged in a non-display region along a first direction.

The strain sensor may be a resistive stain sensor. The resistive strain sensor may include a repeatedly folded strain resistance wire along the first direction with a plurality of folding portions, and the plurality of folding portions may be arranged along a second direction. The at least one strain sensor in the non-display region may be configured to detect the deformation of the display panel along the second direction.

The flexible display panel may further include a signal acquisition circuit coupled to the at least one strain sensor and configured to acquire a detection signal from the at least one strain sensor.

The flexible display panel may further include an amplifier circuit coupled to the signal acquisition circuit, and configured to receive and amplify the detection signal and an AD converter circuit coupled to the amplified circuit and configured to convert the amplified detection signal to a digital signal. The signal acquisition circuit may include a first resistor, a second resistor, a third resistor, and a voltage detector. The first resistor, the second resistor, the third resistor, and the strain sensor may form a Wheatstone bridge, and an output terminal of the voltage detector may output a voltage signal. The signal acquisition circuit may include a first resistor, a second resistor, a third resistor, and a current detector. The first resistor, the second resistor, the third resistor, and the strain sensor may form a Wheatstone bridge, and an output terminal of the current detector may output a current signal.

Another example of the present disclosure is a flexible display apparatus. The flexible display apparatus include the flexible display panel according to one embodiment of the present disclosure. The flexible display apparatus may further include a display controller coupled to the at least a strain sensor. The display controller may be configured to determine a region where the deformation occurs in the flexible display panel based on the detection signal, to determine a target display region based on the region where the deformation occurs in the flexible display panel, and to control display of the target display region. The target display region may include at least one non-deformed region that is at one side of the region where the deformation occurs in the flexible display panel. The display controller may be further configured to acquire information about the number of rows of pixel units in the target display region, to generate a corresponding number of clock signals based on the number of rows of the pixel units in the target display region, and to control the target display region to display through the corresponding number of the clock signals.

Another example of the present disclosure is a display control method of a flexible display apparatus. The display control method may include detecting deformation of the flexible display panel and generating a detection signal, determining a region where the deformation occurs in the flexible display panel based on the detection signal, determining a target display region based on the region where the deformation occurs in the flexible display panel, and controlling display of the target display region. The target display region may include at least one non-deformed region that is at one side of the region where the deformation occurs in the flexible display panel. Controlling display of the target display region may include acquiring information about the number of rows of pixel units in the target display region, generating a corresponding number of clock signals based on the number of rows of the pixel units in the target display region, and controlling the target display region to display through the corresponding number of the clock signals.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-12. When referring to the figures, like structures and elements shown throughout are indicated with like reference numerals.

A flexible display panel, a flexible display apparatus, and a display control method thereof according to embodiments of the present disclosure are described below with reference to the accompanying drawings.

Figure 1:
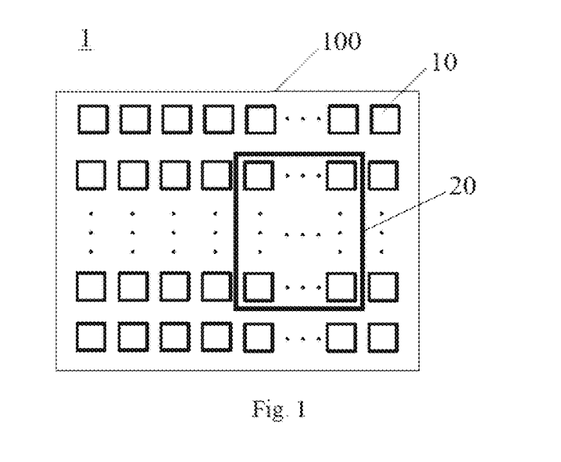
FIG. 1 is a schematic structural diagram of a flexible display panel according to an embodiment of the present disclosure.

FIG. 1 is a schematic structural diagram of a flexible display panel according to an embodiment of the present disclosure.

In one embodiment, as shown in FIG. 1, the flexible display panel 1 includes a display substrate 100, a plurality of pixel units 10 arranged in an array on the display substrate 100, and a strain sensor 20 arranged on the display substrate 100 corresponding to a region including at least one of the plurality of pixel units 10. The strain sensor 20 is used for detecting deformation in the region including at least one of the plurality of pixel units 10 and generating a detection signal.

Figure 2:
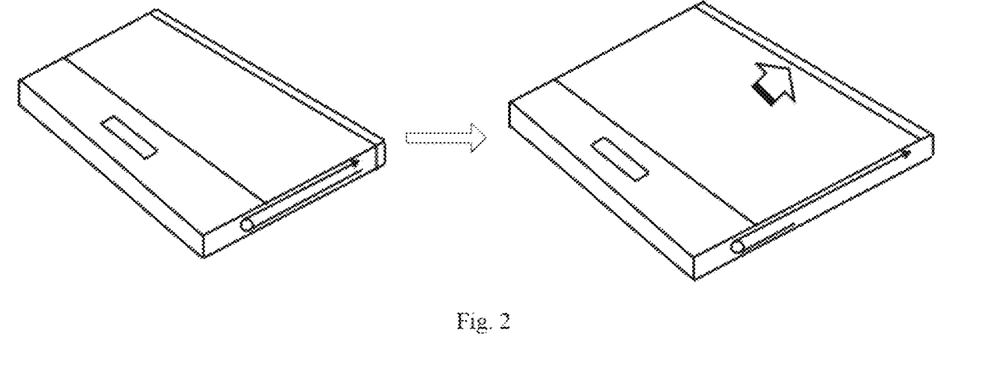
FIG. 2 is a schematic diagram of a rollable flexible display panel according to an embodiment of the present disclosure.
Figure 3:
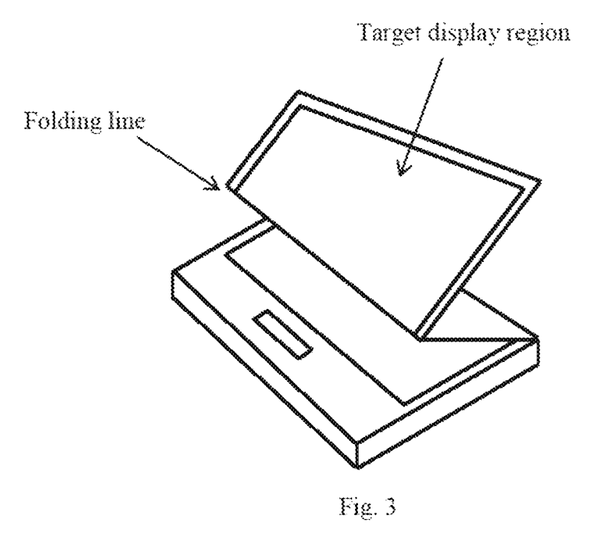
FIG. 3 is a schematic diagram of a foldable flexible display panel according to an embodiment of the present disclosure.
Figure 4:
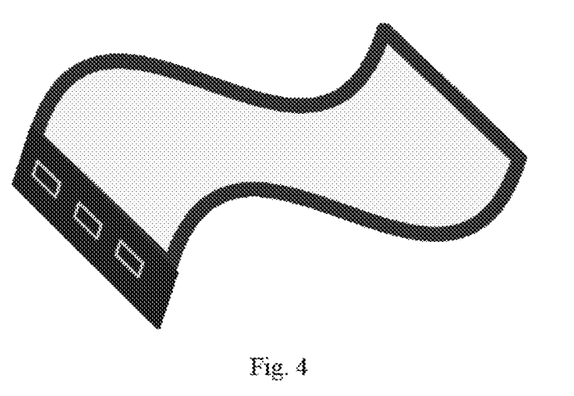
FIG. 4 is a schematic diagram of a bendable flexible display panel according to an embodiment of the present disclosure.

In one embodiment, the display substrate 100 may be made of a plastic film such as a polyimide (PI) film and the like, and is capable of being deformed. In one embodiment of the present disclosure, as shown in FIG. 2, the flexible display panel including the display substrate 100 is a rollable flexible display panel. That is, the flexible display panel including the display substrate 100 can be rolled. In another embodiment, as shown in FIG. 3, the flexible display panel including the display substrate 100 may be a foldable flexible display panel. That is, the flexible display panel including the display substrate 100 can be folded. In one embodiment, as shown in FIG. 4, the flexible display panel including the display substrate 100 may be a bendable flexible display panel. That is, the flexible display panel including the display substrate 100 can be bent. In another embodiment of the present disclosure, a flexible display panel including the display substrate 100 is capable of other forms of deformation which are generated according to actual application of the flexible display panel. It is not set forth herein.

In one embodiment, the strain sensor 20 may be a resistive strain sensor. The resistive strain sensors are arranged respectively corresponding to a region including at least one of the plurality of pixel units 10. When a region including at least one of the plurality of pixel units 10 is deformed, the corresponding resistive strain sensor is also deformed. A resistance of the corresponding resistive strain sensor is changed accordingly. Therefore, when the corresponding resistive strain sensor generates a detection signal based on the change of the resistance, the region including at least one of the plurality of pixel units 10 that is deformed can be determined based on the detection signal.

In one embodiment, the number of the strain sensors 20 may be multiple. A plurality of strain sensors 20 are arranged in different regions of the flexible display panel 1 to detect deformation in the plurality of regions of the flexible display panel 1 respectively.

Figure 5:
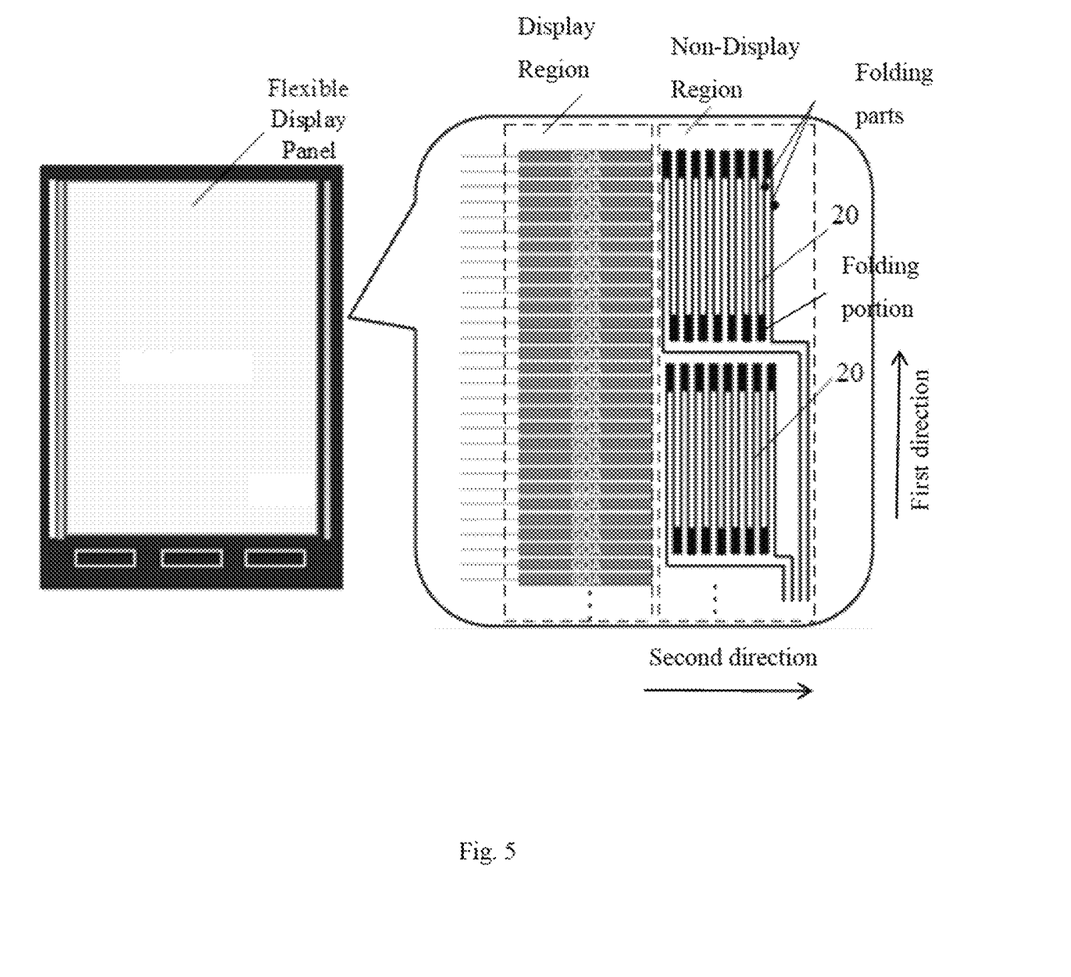
FIG. 5 is a schematic structural diagram of a flexible display panel according to an embodiment of the present disclosure.

In one embodiment, as shown in FIG. 5, the display region of the flexible display panel 1 may include a plurality of Gate-driver On Array (GOA) units arranged in a column direction. Each of the GOA units corresponds to one row of pixel units and one gate line. In other words, the display region of the flexible display panel 1 may include multiple rows of pixel units. In one embodiment, as shown in FIG. 5, each of the plurality of strain sensors 20 is arranged respectively corresponding to a region including a preset number of rows of pixel units 10. The plurality of strain sensors 20 are arranged in the column direction of the pixel units 10. The number of rows of the pixel units 10 corresponding to each of the strain sensors 20 may be the same or not. In other words, the flexible display panel 1 can be divided into a plurality of regions. Each of the plurality of regions includes a corresponding preset number of rows of pixel units 10. A strain sensor 20 is arranged corresponding to each of the plurality of regions. Each of the strain sensors 20 can generate a detection signal when the flexible display panel 1 is stretched in the column direction of the pixel units 10. Thus, when the flexible display panel deforms in the column direction of the pixel units 10, the region where deformation occurs can be determined based on the region which the strain sensor 20 that generates the detection signal among the plurality of strain sensors 20 corresponds to.

Each of the gate lines in the flexible display panel is arranged corresponding to a row of pixel units. Each of the data lines in the flexible display panel is arranged corresponding to a column of pixel units. That is, in one embodiment of the present disclosure, the row direction is parallel to the direction of the gate lines. The column direction is parallel to the direction of the data lines. Since the strain sensors 20 are arranged in the column direction of the pixel units 10, in one embodiment, when the flexible display panel is folded, bent, or rolled along the gate lines, the strain sensors 20 are stretched and generate a detection signal. When the flexible display panel is folded, bent or rolled along the data lines, the strain sensors 20 do not generate a detection signal.

Further, as shown in FIG. 5, the plurality of strain sensors 20 may be arranged in a non-display region at a side of a preset number of rows of pixel units respectively. That is, the strain sensors 20 do not overlap with positions of the pixel units 10, thereby facilitating arrangement and wiring of the strain sensors 20 and preventing the strain sensors 20, the pixel units 10, and the driving circuit of the pixel units 10 from impacting one another with respect to electrical connection, electromagnetism, and heat dissipation and the like.

In one embodiment, as shown in FIG. 5, the resistive strain sensor 20 may be a strain resistance wire having a plurality of folding portions. The plurality of folding portions is arranged in a row direction of the pixel units. That is, in a region corresponding to a preset number of rows of pixel units, a strain resistance wire can be arranged back and forth along the row and column direction of the pixel units so as to form the strain sensor 20, as shown in FIG. 5. There is a plurality of intersecting parts between the plurality of the folding portions and the gate lines. As such, when the region including the corresponding preset number of rows of pixel units is deformed, for example, folded along the gate lines, the positions of the plurality of the intersecting parts are deformed. As a result, deformation of the resistive strain sensor and variation of the resistance of the strain sensor is increased, thereby improving sensitivity of the deformation detection.

It is generally difficult to directly quantify and obtain a change of resistance. In one embodiment, the detection signal generated according to the change of the resistance value can be converted through a signal acquisition apparatus 30 connected with the strain sensor 20 to a conversion signal.

Figure 6:
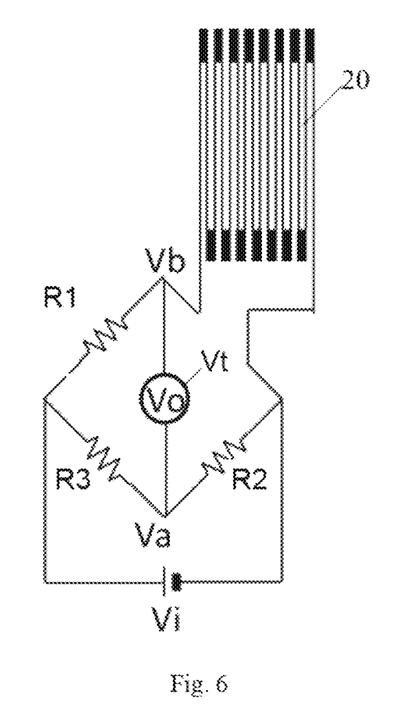
FIG. 6 is a schematic diagram of a circuit of a signal acquisition apparatus according to an embodiment of the present disclosure.

In one embodiment, as shown in FIG. 6, the signal acquisition apparatus 30 may comprise a first resistor R1, a second resistor R2, a third resistor R3, and a voltage detector Vt. A first terminal of the first resistor R1 is connected with a first terminal of the strain sensor 20. A node "b" is present between the first terminal of the first resistor R1 and the first terminal of the strain sensor 20. A first terminal of the second resistor R2 is connected with a second terminal of the strain sensor 20. A second terminal of the first resistor R1 is connected to an anode of a preset power supply, and a first terminal of the second resistor is connected to a cathode of the preset power supply. A first terminal of the third resistor R3 is connected to a second terminal of the first resistor R1. A second terminal of the third resistor R3 is connected to a second terminal of the second resistor R2. There is a node "a" between the second terminal of the third resistor R3 and the second terminal of the second resistor R2. The first terminal of the voltage detector Vt is connected with the first terminal of the first resistor R1. The second terminal of the voltage detector Vt is connected with the second terminal of the second resistor R2. The output terminal of the voltage detector Vt can output a voltage signal. That is, the first resistor R1, the second resistor R2, the third resistor R3, the strain sensor 20 and the voltage detector Vt can form a Wheatstone bridge.

Assuming that the resistances of the first resistor R1, the second resistor R2 and the third resistor R3 are R respectively, when the strain sensor 20 is not deformed, the resistance of the strain sensor 20 is Rs. When the strain sensor 20 is deformed, the amount of change of the resistance thereof is $\Delta Rs$. The voltage of the preset power supply is Vi. The voltage outputted by the voltage detector Vt can be calculated according to the above circuit structure of the signal acquisition apparatus 30, which is the voltage difference between the voltage of the node a and the voltage of the node b, that is, $Vo=Va-Vb=\frac{1}{2}*(R-Rs-\Delta Rs)*Vi/(R+Rs+\Delta Rs)$. Since R, Rs and Vi are constants, the voltage output Vo of the voltage detector Vt is determined only by the amount of change of the resistance $\Delta Rs$ when the strain sensor 20 deforms.

Figure 7:
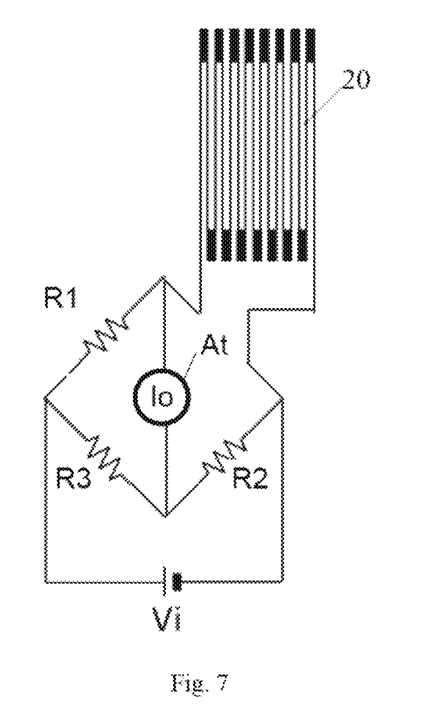
FIG. 7 is a schematic diagram of a circuit of a signal acquisition apparatus according to an embodiment of the present disclosure.

In one embodiment, as shown in FIG. 7, the signal acquisition apparatus 30 may comprise a first resistor R1, a second resistor R2, a third resistor R3, and a current detector At. A first terminal of the first resistor R1 is connected with a first terminal of the strain sensor 20. A first terminal of the second resistor R2 is connected with a second terminal of the strain sensor 20. A second terminal of the first resistor R1 is connected to an anode of a preset power supply. A first terminal of the second resistor is connected to a cathode of the preset power supply. A first terminal of the third resistor R3 is connected with the second terminal of the first resistor R1. A second terminal of the third resistor R3 is connected with the second terminal of the second resistor R2. A first terminal of the current detector At is connected with the first terminal of the first resistor R1. A second terminal of the current detector At is connected with the second terminal of the second resistor R2. The output terminal of the current detector At outputs a current signal. That is, the first resistor R1, the second resistor R2, the third resistor R3, and the strain sensor can form a Wheatstone bridge.

Similarly, the current Io outputted by the current detector At is determined only by the amount of change of the resistance of the strain sensor $\Delta Rs$ when the strain sensor 20 deforms.

Thus, with the Wheatstone bridge shown in FIG. 6 or FIG. 7, a signal of a change of resistance of the strain sensor 20 can be converted into a current signal or a voltage signal.

Figure 8:
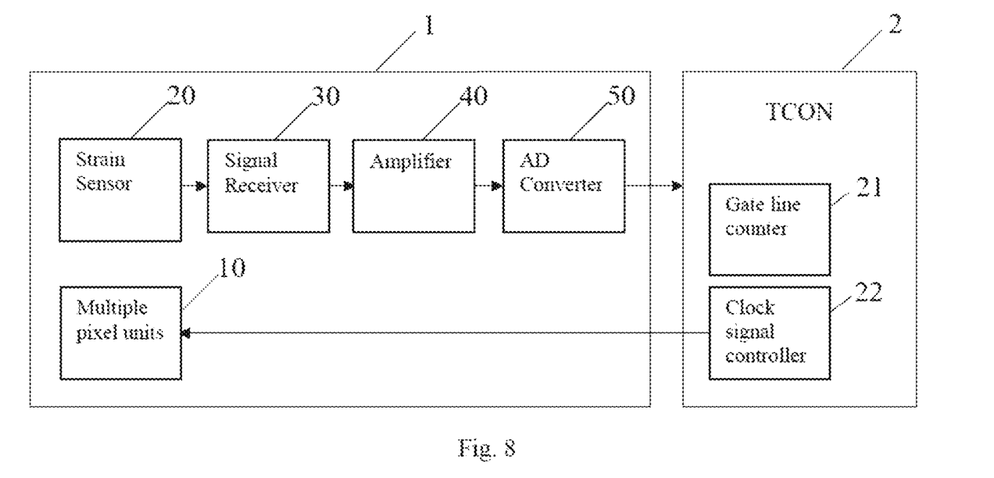
FIG. 8 is a schematic structural diagram of a flexible display apparatus according to an embodiment of the present disclosure.

After the conversion signal is obtained, in general, a display controller, such as a Time Control Register (TCON, timer/counter control register/logic board) is used to identify the conversion signal to finally determine the region where the deformation occurs. The current or voltage signal obtained by the conversion is generally very small. Therefore, in one embodiment, as shown in FIG. 8, an amplifier 40 may be connected with the signal acquisition apparatus 30 to amplify the conversion signal obtained by the signal acquisition apparatus 30. In addition, since the display controller such as the TCON generally identifies digital signals, as shown in FIG. 8, an Analog to Digital (AD) converter 50 may be connected with the amplifier 40 to perform the AD conversion of the amplified conversion signals.

In one embodiment, each of the strain sensors 20 may be correspondingly provided with a signal acquisition apparatus 30, an amplifier 40, and an AD converter 50. In another embodiment, each of the strain sensors 20 may be correspondingly provided with a signal acquisition apparatus 30. The plurality of signal acquisition apparatuses 30 corresponding to the plurality of strain sensors 20 are connected to an amplifier 40. That is, the plurality of strain sensors 20 shares one amplifier 40 and one AD converter 50. The signal acquisition apparatuses 30, the amplifier 40 and the AD converter 50 may be disposed on the display substrate 100. In one embodiment, the signal acquisition apparatus 30, the amplifier 40, and the AD converter 50 may be integrated with the corresponding strain sensor 20, and are disposed in a non-display region of the display substrate together with the corresponding strain sensor 20. Thus, the display controller such as the TCON can determine the region where the deformation occurs in the flexible display panel 1 based on the received digital signal, thereby facilitating further display control of the flexible display panel 1.

In conclusion, according to the embodiment of the present disclosure, by arranging strain sensors on the display substrate, the deformed region of the flexible display panel can be conveniently and effectively detected.

Another example of the present disclosure is a flexible display apparatus. The flexible display apparatus includes the flexible display panel 1 provided according to one embodiment of the present disclosure.

Figure 9:
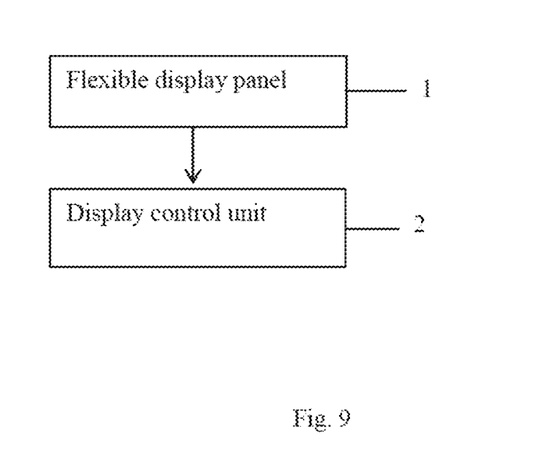
FIG. 9 is a schematic block diagram of a flexible display apparatus according to an embodiment of the present disclosure.

In one embodiment, as shown in FIG. 9, the flexible display apparatus further comprises a display controller 2. The display controller 2 is connected with the strain sensor 20. The display controller 2 is used for determining the region where deformation occurs in the flexible display panel 1 based on the detection signal generated by the strain sensor 20; determining a target display region based on the region where the deformation occurs in the flexible display panel 1; and generating a display control signal of the target display region.

After the flexible display panel is deformed, especially when a large-amplitude of deformation occurs, such as the panel being folded, it is difficult for the complete display region of the flexible display panel to be presented to the user at the same time. Therefore, after the flexible display panel is deformed, the region of the flexible display panel that can be presented to the user is considered as a target display region. FIG. 3 shows a target display region after the flexible display panel is folded. As shown in FIG. 3, the target display region is located at a side of the folding line and can be presented to the user. A display control signal of the target display region is generated to control the target display region to display. The display of other regions of the flexible display panel that cannot be presented to the user after being deformed can be controlled to be turned off to save electrical energy.

In one embodiment, the target display region may include at least a region that is not deformed at a side of the region where deformation occurs in the flexible display panel.

After the target display region is determined, the display controller 2 can obtain the number of rows of pixel units in the target display region, generate a corresponding number of clock signals based on the number of rows of pixel units in the target display region, and control the target display region to display through the corresponding number of clock signals. As such, the preset number of pixel units in the deformed region can be controlled not to display, the plurality of rows of pixel units at one side of the deformed region is controlled to display, and the plurality of rows of pixel units at the other side of the deformed region is controlled not to display.

Figure 10:
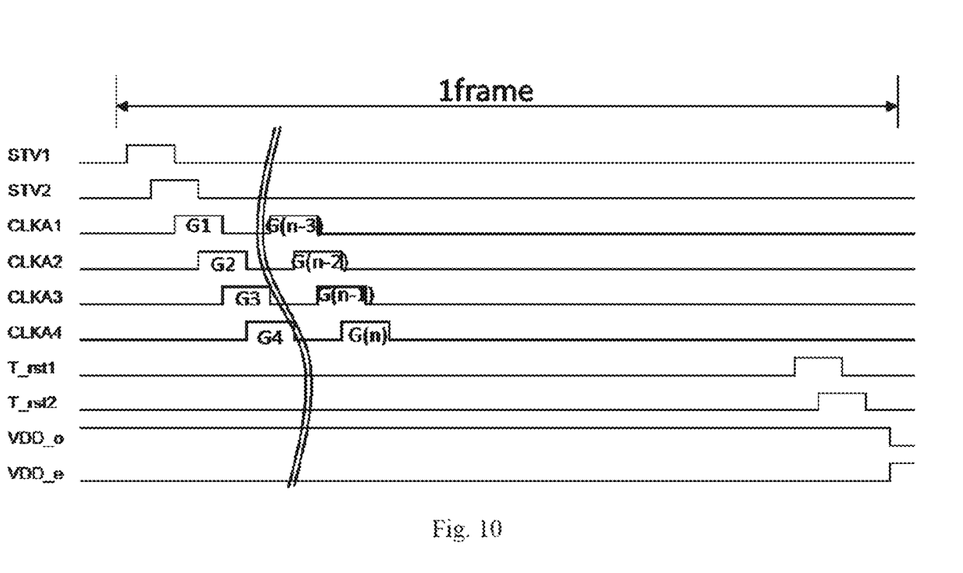
FIG. 10 is a timing diagram of clock signals according to an embodiment of the present disclosure.

In one embodiment, as shown in FIG. 8, the display controller 2 identifies the resistive strain sensor whose resistance changed based on the digital signal outputted by the AD converter 50 and then identifies the deformed region in the flexible display panel 1. After the deformed region is identified, a gate line counter 21 in the display controller 2 can be further used to obtain the number of the gate lines n in a non-deformed region at a side of the deformed region. That is, the number of rows n of the pixel units in the target display region. Then, a clock signal controller 22 in the display controller 2 correspondingly outputs n clock signals G1 to G(n), as shown in FIG. 10, and input driving control signals of the n rows of pixel units to the GOA units of the corresponding n gate lines, thereby controlling the n rows of pixel units among the plurality of pixel units to display.

Figure 11:
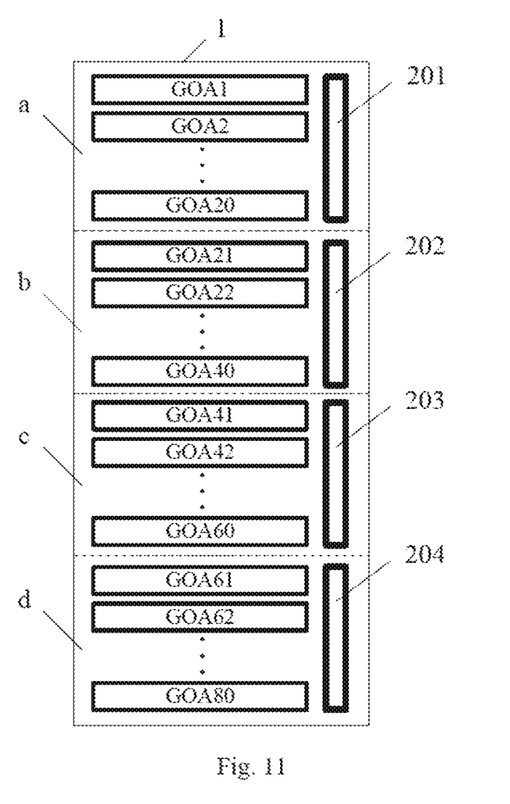
FIG. 11 is a schematic structural diagram of a flexible display panel according to an embodiment of the present disclosure.

In one embodiment, as shown in FIG. 11, the flexible display panel 1 includes four deformable regions. The resistive strain sensor 201 in region a is arranged corresponding to GOA 1 to GOA 20, that is, corresponding to the pixel units of the first row to the twentieth row. The resistive strain sensor 202 in region b is arranged corresponding to GOA 21 to GOA 40, that is, corresponding to the pixel units of the twenty-first row to the fortieth row. The resistive strain sensor 203 in region c is arranged corresponding to GOA 41 to GOA 60, that is, corresponding to the pixel units of the forty-first row to the sixtieth row. The resistive strain sensor 204 in region d is arranged corresponding to GOA 61 to GOA 80, that is, corresponding to the pixel units of the sixty-first row to the eightieth row. If the display controller 2 receives a voltage signal generated by the resistive strain sensor 203 due to deformation of the resistive strain sensor 203, the display controller 2 can determine region c as the region where the deformation occurs. Assuming that the region of the flexible display panel 1 from the first row of pixel units to the deformed region is presented to the user after the deformation under this scenario, the display controller 60 can determine regions a and b as the target display region. The gate line counter 21 counts the total number of the gate lines in the regions a and b to obtain a numerical value 40, and accordingly the clock signal controller 22 outputs 40 clock pulses to drive the pixel units of the first row to the fortieth row to display through GOA 1 to GOA 40.

In the flexible display apparatus according to one embodiment of the present disclosure, a strain sensor 20 is arranged on the display substrate to conveniently and effectively detect the region where the deformation occurs in the flexible display panel. A display controller is then utilized to determine a target display region based on the region where the deformation occurs so that a part of the flexible display panel can be controlled to display after the deformation, thereby meeting actual viewing demands of the user and reducing electric energy consumption simultaneously.

Based on the above embodiment, a display control method of the flexible display apparatus is further provided according to one embodiment of the present disclosure.

Figure 12:
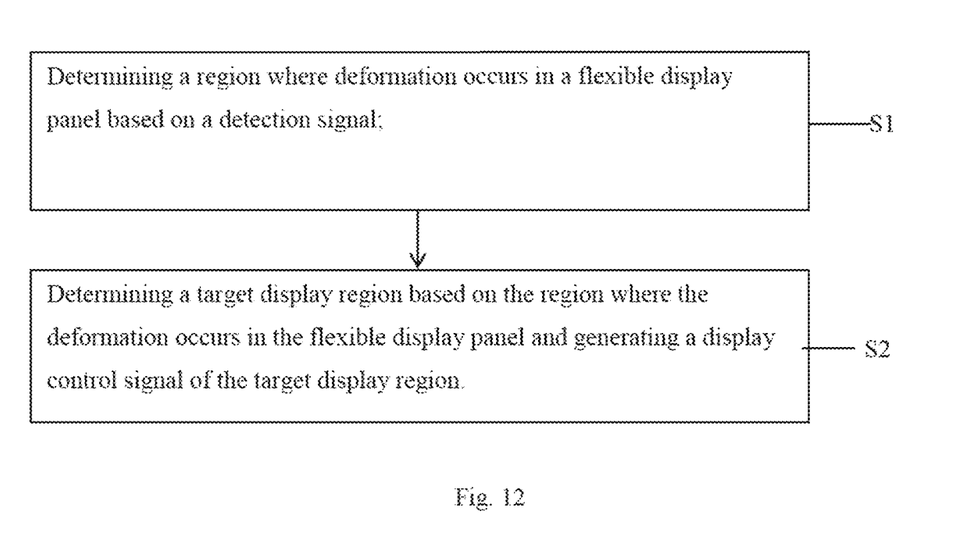
FIG. 12 is a flowchart of a display control method of a flexible display apparatus according to an embodiment of the present disclosure.

As shown in FIG. 12, the display control method of the flexible display apparatus according to the embodiment of the present disclosure comprises the following steps:

In step S1, the region where the deformation occurs in the flexible display panel is determined based on the detection signal.

In one embodiment, the flexible display panel may include a plurality of deformable regions. Each deformable region comprises a corresponding preset number of rows of pixel units. A strain sensor is arranged corresponding to the preset number of rows of pixel units.

In one embodiment, the strain sensor may be a resistive strain sensor. When a certain deformable region deforms, the corresponding resistive strain sensor deforms and the resistance of the resistive strain sensor changes accordingly. Therefore, when the resistive strain sensor generates a detection signal based on the change of the resistance, the corresponding deformable region that deforms can be determined based on the detection signal.

As shown in FIG. 5, the strain sensor can be respectively arranged in a non-display region at a side of the preset number of rows of pixel units, that is, the strain sensor does not overlap the positions of the pixel units, thereby facilitating arrangement and wiring of the strain sensor, and preventing the strain sensors, the pixel units and the driving circuit of the pixel units 10 from impacting one another with respect to electrical connection, electromagnetism, and heat dissipation and the like.

In one embodiment, as shown in FIG. 5, the resistive strain sensor 20 may be a strain resistance wire with a plurality of folding portions, and the plurality of folding portions are arranged in the row direction of the pixel units. That is, in the region where the corresponding preset number of rows of pixel units is located, the strain resistance wire can be arranged back and forth along the row and column directions of the pixel units, forming a strain sensor as shown in FIG. 5. There is a plurality of intersecting parts between the plurality of the folding portions and the gate lines. As such, when the region including the corresponding preset number of rows of pixel units is deformed, for example, folded along the gate lines, the positions of the plurality of the intersecting parts are deformed. As a result, deformation of the resistive strain sensor and variation of the resistance of the strain sensor is increased, thereby improving sensitivity of the deformation detection.

It is generally difficult to directly quantify and obtain the amount of change of the resistance. Therefore, a detection signal generated based on the change of the resistance can be converted to a conversion signal. In one embodiment, the Wheatstone bridge shown in FIG. 6 or FIG. 7 can be used to convert the detection signal of the change of the resistance of the strain sensor 20 to a current signal or a voltage signal.

After the conversion signal is obtained, a display controller such as a TCON or the like generally identifies the conversion signal to finally determine the region where the deformation occurs. The current signal or the voltage signal obtained by the conversion is generally very small. Therefore, in one embodiment, the conversion signal can be subjected to amplification and AD conversion. The obtained digital signal can be transmitted to the display controller such as a TCON. As such, the TCON or other display controllers can determine the region that deforms in the flexible display panel based on the received digital signals.

In step S2, a target display region is determined based on the region where the deformation occurs in the flexible display panel, and a display control signal of the target display region is generated.

After the flexible display panel is deformed, especially when a large-amplitude of deformation occurs, such as the panel being folded, it is difficult for the complete display region of the flexible display panel to be presented to the user at the same time. Therefore, after the flexible display panel is deformed, the region of the flexible display panel that can be presented to the user is considered as a target display region. A display control signal of the target display region is generated to control the target display region to display. The display of other regions of the flexible display panel that cannot be presented to the user after being deformed can be controlled to be turned off to save electrical energy.

In one embodiment, the target display region can be composed of at least one region that is not deformed at a side of the region that is deformed in the flexible display panel.

After the target display region is determined, the number of rows of pixel units in the target display region can be obtained, and a corresponding number of clock signals are generated based on the number of rows of pixel units in the target display region. The target display region is controlled to display through the corresponding number of the clock signals. Therefore, the preset number of pixel units in the deformed region can be controlled not to display. A plurality of rows of pixel units at one side of the deformed region is controlled to display, and a plurality of rows of pixel units at the other side of the deformed region is controlled not to display.

In one embodiment, the change of the resistance of the resistive strain sensor 20 can be determined based on the digital signals so as to determine the region where deformation occurs in the flexible display panel. After the region where deformation occurs is determined, the number of the gate lines n in the region that does not deform at one side of the region where deformation occurs can be further obtained, that is, the number of rows of the pixel units n in the target display region. Then, n clock signals are outputted correspondingly, as shown in FIG. 10. Driving control signals of the n rows of pixel units are input to GOA units corresponding to the n gate lines, and the n rows of pixel units are controlled to display.

In one embodiment, as shown in FIG. 11, the flexible display panel 1 includes four deformable regions. The resistive strain sensor 201 in region a is arranged corresponding to GOA 1 to GOA 20, that is, corresponding to the pixel units of the first row to the twentieth row. The resistive strain sensor 202 in region b is arranged corresponding to GOA 21 to GOA 40, that is, corresponding to the pixel units of the twenty-first row to the fortieth row. The resistive strain sensor 203 in region c is arranged corresponding to GOA 41 to GOA 60, that is, corresponding to the pixel units of the forty-first row to the sixtieth row. The resistive strain sensor 204 in region d is arranged corresponding to GOA 61 to GOA 80, that is, corresponding to the pixel units of the sixty-first row to the eightieth row. If the display controller 2 receives a voltage signal generated by the resistive strain sensor 203 due to deformation of the resistive strain sensor 203, the display controller 2 can determine region c as the region where the deformation occurs. Assuming that the region of the flexible display panel 1 from the first row of pixel units to the deformed region is presented to the user after the deformation under this scenario, the display controller 60 can determine regions a and b as the target display region. The gate line counter 21 counts the total number of the gate lines in the regions a and b to obtain a numerical value 40, and accordingly the clock signal controller 22 outputs 40 clock pulses to drive the pixel units of the first row to the fortieth row to display through GOA 1 to GOA 40.

In the display control method of the flexible display apparatus according to one embodiment of the disclosure, the region where the deformation occurs in the flexible display panel is determined based on the detection signal. The target display region is determined based on the region where the deformation occurs, so that a part of the flexible display panel can be controlled to display after the flexible display panel deforms, thereby meeting actual viewing demands of the user and reducing electric energy consumption simultaneously.

In the description of the present disclosure, the terms "center," "horizontal," "vertical," "length," "width," "thickness," "upper," "lower," "front," "back," "left," "right," "vertical," "horizontal," "top," "bottom," "inner," "outer," "a clockwise direction," "an anticlockwise direction," "an axial direction," "a radial direction," "a circumferential direction," or the like are based on the orientation or positional relationship shown in the drawings. They are used merely for convenience of description and simplifying the description of the present invention, but not to indicate or imply that the indicated apparatus or element must have a specific orientation, or be constructed and operated in a specific orientation, therefore cannot be construed as a limitation of the present disclosure.

In addition, the terms "first" and "second" are for illustration purposes only and are not to be construed as indicating or implying relative importance or implied reference to the quantity of indicated technical features. Thus, features defined by the terms "first" and "second" may explicitly or implicitly include one or more of the features. In the description of the present disclosure, the meaning of "plural" is two or more unless otherwise specifically and specifically defined.

In the present invention, the terms "mounted," "connected," "fixed," and the like should be broadly understood unless expressly stated and limited otherwise. For example, they can be construed as fixedly connected or detachably connected or integrally connected. They can be mechanically connected or electrically connected and can be directly connected or indirectly connected through an intermediate medium. There can also be an internal connection between two elements. A person of ordinary skill in the art would understand the specific meaning of the terms in the disclosure in specific situations.

In the disclosure, unless explicitly stated and defined otherwise, when the first feature is "above" the second feature or "below" the second feature, the two features can be in direct contact or indirect contact through an intermediate medium. Also, that the first feature is "above" the second feature can be that the first feature is above or obliquely above the second feature, or only a height of the first feature is higher than that of the second feature. That the first feature is "below" the second feature can be that the first feature is below or obliquely below the second feature, or only indicates that a height of the first feature is smaller than that of the second feature.

In the description of the specification, references made to the term "one embodiment," "some embodiments," and "exemplary embodiments," "example," and "specific example," or "some examples" and the like are intended to refer that specific features and structures, materials or characteristics described in connection with the embodiment or example that are included in at least one embodiment or example of the present disclosure. The schematic expression of the terms does not necessarily refer to the same embodiment or example. Moreover, the specific features, structures, materials or characteristics described may be included in any suitable manner in any one or more embodiments or examples.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Description of Symbols in the Drawings:
1: flexible display panel
2: display controller
100: display substrate
10: pixel unit
20: strain sensor
30: signal acquisition apparatus
40: amplifier
50: AD converter

What is claimed is:

1. A flexible display apparatus, comprising:
a flexible display panel and a display controller,
wherein the flexible display panel includes a display substrate, a plurality of pixel units arranged in an array on the display substrate, and a plurality of strain sensors on the display substrate;
the display controller is coupled to the strain sensors, and the strain sensors are configured to detect deformation of the flexible display panel to generate a detection signal;
each of the strain sensors corresponds to a region of the flexible display panel, and the region includes a preset number of rows of the pixel units;
the display controller is configured to determine a region where the deformation occurs in the flexible display panel based on the detection signal, to determine a target display region based on the region where the deformation occurs in the flexible display panel, and to control display of the target display region;
the display controller includes a gate line counter and the gate line counter determines a number of rows of the pixel units in the target display region based on the detection signal;
the display controller is further configured to acquire information about the number of rows of the pixel units in the target display region, to generate a corresponding number of clock signals based on the number of rows of the pixel units in the target display region, and to control the target display region to display through the corresponding number of the clock signals; and
the number of rows of the pixels units is equal to the corresponding number of clock signals.

2. The flexible display apparatus according to claim 1, wherein the target display region comprises at least one non-deformed region that is at one side of the region where the deformation occurs in the flexible display panel.

3. A display control method of the flexible display apparatus of claim 1, comprising:
detecting deformation of the flexible display panel and generating the detection signal;
determining the region where the deformation occurs in the flexible display panel based on the detection signal;
determining the target display region based on the region where the deformation occurs in the flexible display panel, and
controlling display of the target display region.

4. The display control method according to claim 3, wherein controlling display of the target display region comprises:
acquiring information about the number of rows of pixel units in the target display region;
generating the corresponding number of clock signals based on the number of rows of the pixel units in the target display region; and
controlling the target display region to display through the corresponding number of the clock signals.

5. The flexible display panel according to claim 1, wherein the strain sensors are arranged in a non-display region along a first direction.

6. The flexible display apparatus according to claim 1, wherein the strain sensor is a resistive strain sensor.

7. The flexible display apparatus according to claim 6, wherein the resistive strain sensor comprises a repeatedly folded strain resistance wire along the first direction with a plurality of folding portions and the plurality of folding portions are arranged along a second direction.

8. The flexible display apparatus according to claim 7, wherein the strain sensors in the non-display region are configured to detect the deformation of the display panel along the second direction.

9. The flexible display apparatus according to claim 1, further comprising a signal acquisition circuit coupled to the strain sensors and configured to acquire the detection signal from the strain sensors.

10. The flexible display panel according to claim 9, wherein the signal acquisition circuit comprises a first resistor, a second resistor, a third resistor, and a voltage detector, and
- wherein the first resistor, the second resistor, the third resistor, and the strain sensor form a Wheatstone bridge, and an output terminal of the voltage detector outputs a voltage signal.

11. The flexible display apparatus according to claim 9, wherein the signal acquisition circuit comprises a first resistor, a second resistor, a third resistor, and a current detector, and
- wherein the first resistor, the second resistor, the third resistor, and the strain sensor form a Wheatstone bridge, and an output terminal of the current detector outputs a current signal.

12. The flexible display apparatus according to claim 1, further comprising:
- an amplifier circuit coupled to the signal acquisition circuit, and configured to receive and amplify the detection signal; and
- an AD converter circuit coupled to the amplified circuit and configured to convert the amplified detection signal to a digital signal.

\* \* \* \* \*